United States Patent [19]

Hashimoto

[11] Patent Number: 4,621,206
[45] Date of Patent: Nov. 4, 1986

[54] LEVEL DETECTOR

[75] Inventor: Masaru Hashimoto, Yokohama, Japan

[73] Assignee: Kabushiki Kaisha Toshiba, Kawasaki, Japan

[21] Appl. No.: 610,669

[22] Filed: May 16, 1984

[30] Foreign Application Priority Data

May 18, 1983 [JP] Japan ................... 58-87031

[51] Int. Cl.$^4$ .................. H03K 5/08; G01R 19/22
[52] U.S. Cl. ................... 307/350; 307/261; 307/264; 307/362; 328/26; 330/2
[58] Field of Search ............ 307/264, 350, 362, 261; 330/258, 2; 328/26

[56] References Cited

U.S. PATENT DOCUMENTS

| | | | |
|---|---|---|---|
| 3,770,983 | 11/1973 | Gray | 307/350 |
| 4,007,427 | 2/1977 | Leidich | 330/20 |
| 4,072,907 | 2/1978 | Sekiva et al. | 330/261 |
| 4,088,962 | 5/1978 | Trilling | 330/258 |
| 4,232,271 | 11/1980 | Dobkin et al. | 330/258 |
| 4,264,873 | 4/1981 | Kominami et al. | 330/257 |
| 4,295,100 | 10/1981 | Kraemer | 330/257 |

FOREIGN PATENT DOCUMENTS 3119923 2/1982 Fed. Rep. of Germany.

OTHER PUBLICATIONS

Japanese Patent Publication (KOKOKU) No. 57-18721.

Primary Examiner—John Zazworsky
Attorney, Agent, or Firm—Finnegan, Henderson, Farabow, Garrett & Dunner

[57] ABSTRACT

Disclosed is a level detector in use with a differential amplifier circuit in an amplitude-limiting amplifying system for angle-modulation signal amplification. The differential amplifier circuit is made up of differentially paired transistors. The level detector contains first and second transistors which form a differential pair. In the first transistor, the base is connected to an interjunction of the emitters of the differentially paired transistors. A second transistor is connected at the emitter to the emitter of the first transistor. A current source is connected to the emitter interjunction of the first and second transistors. A bias circuit applies a predetermined bias potential to the base of the second transistor. An output signal containing the detected level information of the input signal is derived from the collector of the first or second transistor.

6 Claims, 5 Drawing Figures

LEVEL DETECTOR

BACKGROUND OF THE INVENTION

The present invention relates to a level detector for use with a differential amplifier circuit in an amplitude-limiting amplifying system for angle-modulation signal amplification and, more particularly, to a level detector fabricated by an integrated circuit technology.

In an amplitude-limiting amplifying system for treating angle-modulation signals in FM or TV receivers, for example, it is common practice that a DC signal level derived from an IF stage is detected by a level detector and used for driving a level meter or a tuning indicator.

One of the level detectors of this type is disclosed in Kokoku No. 57/18721. In this Gazette, part of the output signal of an amplitude-limiting amplifying circuit is delivered to a rectifier circuit by a capacitive coupling.

FIG. 1 shows a circuit diagram of a conventional level detector. An amplitude-limiting amplifying circuit 1 is comprised of a pair of NPN transistors Q1 and Q2 forming a differential pair, resistors R1 and R2, and a constant current source I1. The differentially paired NPN transistors Q1 and Q2 are connected together at the emitters and respectively coupled at the bases to differential input signals IF1 and IF2. The resistors R1 and R2 are respectively connected at first ends to the collectors of the transistors Q1 and Q2 and at the second ends connected together to a power source terminal 2a for a power voltage Vcc. The constant current source I1 is connected between a node of the emitters of the transistors Q1 and Q2 and ground. Output signals OUT1 and OUT2 are derived from nodes placed respectively between the collectors of the differential transistor pair Q1 and Q2 and the resistors R1 and R2. One of the output signals is delivered to an IF stage or an audio detector stage, while the other to a rectifier circuit 5, through an emitter follower circuit 3 including an NPN transistor Q3 and a resistor R3, and a coupling capacitor 4. The rectifier circuit 5 is comprised of NPN transistors Q4–Q6, a constant current source I2, bias diodes D1–D3, and a smoothing capacitor 7. The NPN transistor Q4 is connected at the collector to the power source terminal 2b applied with a power voltage Vcc and at the emitter to one of the electrodes of the coupling capacitor 4. The constant current source I2 is connected between the base of the transistor Q4 and the power source terminal 2b. The bias diodes D1–D3 are connected in series between the base of the transistor Q4 and ground. The NPN transistor Q5 is connected at the collector to the power source terminal 2b and at the base to the emitter of the transistor Q4. The NPN transistor Q6 is connected at the base to the emitter of the transistor Q5, at the collector to an output terminal 6, and at the emitter to ground. The smoothing capacitor 7 is connected between the base and the emitter of the transistor Q6.

The coupling capacitor 4 is charged such that its input is set to negative polarity during the negative cycle of both input signals IF1 and IF2. During the positive cycle of these input signals, the input signal passing through the coupling capacitor 4 is supplied as a forward bias to the base of the transistor Q5. Then, the transistor Q5 is turned on to cause a voltage to appear across the smoothing capacitor 7. The voltage generated turns on the transistor Q6 to produce a DC current at an output terminal 6 coupled with the collector of the transistor Q6.

As described above, the two capacitors 4 and 7 are used in the conventional level detector comprised of the emitter follower circuit 3, the coupling capacitor 4, and the rectifier circuit 5. Therefore, when fabricated into an integrated circuit, it necessarily occupies a larger area on the chip. Particularly, when the frequency of each input signal IF1 and IF2 is low, for example, 455 KHz, it is necessary to use a relatively large capacitor for the coupling capacitor 4. As a result, a necessary chip occupying area for the detector is increased. In the case of 455 KHz, a pattern area necessary for the coupling capacitor 4 is approximately 100 times that of each of the transistors Q1–Q6. Further, the use of the capacitors 4 and 7 makes a rectifying efficiency very sensitive to the frequency of the input signal. The DC output of the level detector when it is applied to the 455 KHz IF stage is different from that when it is applied for the 10.7 MHz IF stage. For coupling the level detector with a level meter, it is necessary to adjust the DC level before it is applied to the level meter. Further, the capacitors 4 and 7 tend to vary in capacitance value in the manufacturing stage. This inevitably varies the rectifiying efficiency, resulting in an indefinite reading of the meter.

SUMMARY OF THE INVENTION

Accordingly, an object of the present invention is to solve the problems associated with the use of the coupling and smoothing capacitors in a level detector. It is a feature of the present invention to solve the problems by not using those capacitors. An advantage to be derived is a level detector requiring less chip area. Another advantage is a level detector capable of detecting, with substantially constant efficiency, an amplitude of an input signal to an amplitude-limiting amplifier circuit over a wide frequency range.

According to the present invention, there is provided a level detector in use with a differential amplifier circuit in an amplitude-limiting amplifying system for angle-modulation signal amplification. The differential amplifier circuit contains transistors commonly emitter-connected to form a differential pair. The level detector also includes differentially paired transistors of which the emitters are connected together to a constant current source. One of the paired transistors is DC coupled at the base to the emitter node of the differentially coupled transistors in the differential amplifier. The other is coupled at the base with a predetermined bias potential as applied from a bias circuit. An output signal of the level detector is derived from the collector of the first transistor, depending on a base input potential.

With such an arrangement, an output signal of the level detector depends on a voltage appearing at the emitter node in the differential amplifier circuit and generated by half-wave rectifying both input signals to the amplifier circuit and combining these rectified signals. The voltage takes a substantially DC form when the differential amplifier is saturated. This indicates that the level detector output at this time can be treated as a DC signal.

DETAILED DESCRIPTION OF THE PREFERRED EMBODIMENTS

Figure 1:
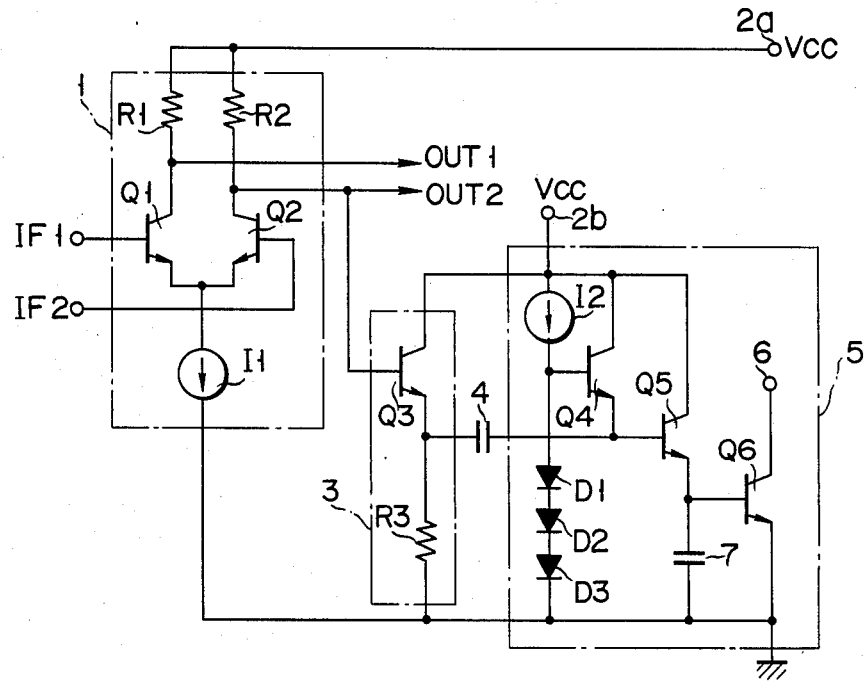
FIG. 1 is a circuit diagram of a conventional level detector for an amplitude-limiting amplifying circuit.
Figure 2:
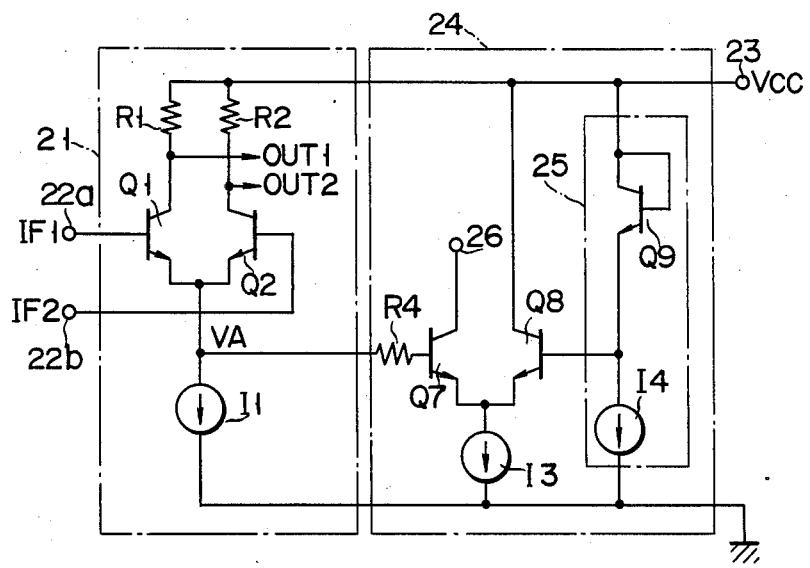
FIG. 2 is a circuit diagram of a first embodiment of a level detector according to present invention.

Reference is made to FIG. 2 illustrating an embodiment of a level detector according to the present invention, which is coupled with one of the IF multiple stages in an FM receiver, for example. A differential amplifying circuit 21, or an amplitude-limiting amplifying circuit, is provided for amplifying input signals (IF signals) IF1 and IF2 supplied from the preceding IF stage, and supplies the amplified one to the succeeding IF stage or an audio detector stage (not shown). Input terminals 22a and 22b, supplied with the input signals IF1 and IF2, are respectively coupled with the bases of differentially paired transistors Q1 and Q2. A connection point of the emitters of the transistors Q1 and Q2 is connected to one end of a constant current source I1 which is further connected at the other end to ground. The collectors of the transistors Q1 and Q2 are connected respectively through load resistors R1 and R2 to a power source terminal 23 for a positive power voltage Vcc. Output signals OUT1 and OUT2 of the differential amplifier circuit 21 are respectively derived from a connection point of the load resistor R1 and the transistor Q1 and a connection point of the load resistor R2 and the transistor Q2. These outputs OUT1 and OUT2 are supplied to the succeeding IF stage or an audio detector stage. A potential at the interjunction of the emitters of the transistors Q1 and Q2 is applied to a level detector 24. The level detector 24 is comprised of an input resistor R4, a pair of transistors Q7 and Q8, a constant current source I3, and a bias circuit 25. The emitter interjunction of the transistors Q1 and Q2 is connected to the base of the transistor Q7, through the input resistor R4. The collector of the transistor Q7 is coupled with an output terminal 26 for providing a detected signal level (DC level). The emitter of the transistor Q7 is connected to the emitter of the transistor Q8. Inserted between the emitter interjunction and ground is a constant current source I3. The collector of the transistor Q8 is connected to the power source terminal 23. The base of the transistor Q8 is connected to the emitter of the NPN transistor Q9 of which the collector and the base are both connected to the power source terminal 23. A constant current source I4 is connected between the emitter of the transistor Q9 and ground.

Figure 3:
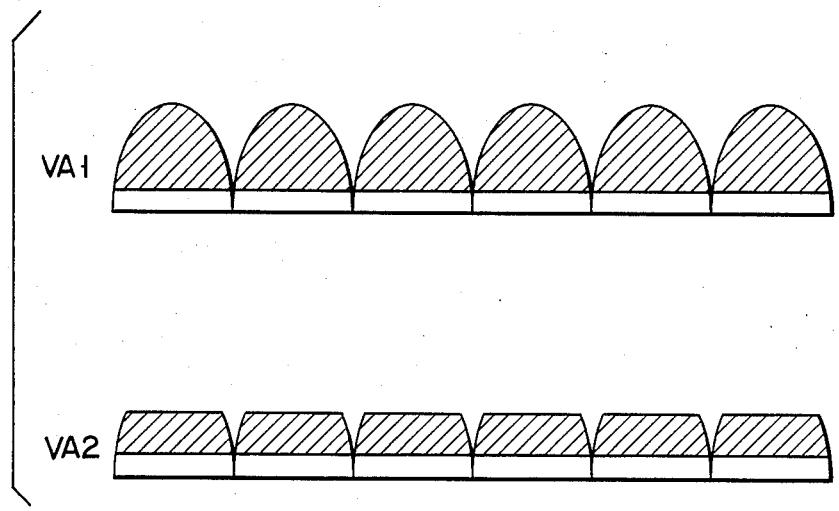
FIG. 3 shows voltage waveforms useful in explaining the operation of the level detector of FIG. 2.

The operation of the level detector thus arranged will be given referring to FIG. 3. Input signals IF1 and IF2 are respectively applied to the input terminals 22a and 22b of the differential amplifier circuit 21. Then, a voltage VA appearing at the emitter node of the transistors Q1 and Q2 takes waveforms as shown in FIG. 3. The waveforms are each similar to a full-wave rectified waveform. For the amplitude of the input signals IF1 and IF2, which are above a predetermined value, the differential amplifier circuit 21 operates in a saturated fashion to limit the amplitudes of the input signals. The waveform VA1 in FIG. 3 is obtained when the differential amplifier circuit is not saturated. The waveform VA2 is when the differential amplifier circuit is substantially saturated. Although only two extreme examples of waveforms are illustrated, the amplitude limiting widely changes depending on the amplitude of the input signals, and provides various waveforms with different amplitudes. In the level detector 24, the bias circuit 25 applies a bias voltage to the base of the transistor Q8 so that only the transistor Q8 is driven to allow a current flow therethrough when the amplitudes of the input signals IF1 and IF2 are zero, that is, no signal is applied to the differential amplifier circuit 21. Accordingly, when the differential amplifier circuit 21 is supplied with no signal, the transistor Q7 is in an OFF state. Then, let us assume that the input signals IF1 and IF2 are applied to the differential amplifier circuit 21, and the voltage VA with a waveform as shown in FIG. 3 is applied to the base of the transistor Q7. In this case, during a period when the base potential of the transistor Q7 is higher than that of the transistor Q8 (as illustrated by slanted lines in FIG. 3), current flows through the transistor Q7, depending on the amplitudes of the input signals IF1 and IF2. When the amplitudes of the input signals are very large, the differential amplifier circuit 21 is greatly saturated and hence the waveform of the voltage VA approximates to the DC waveform. Therefore, the current output from the transistor Q7 is substantially a DC current. The DC current derived from the output terminal 26 connecting to the collector of the transistor Q7 is used for driving a level meter, for example.

The circuit arrangement as mentioned uses no coupling capacitor, and hence requires less chip area in the IC fabrication. In this respect, the circuit arrangement is suitable for IC fabrication. Further, the arrangement is free from a variability of capacitances and is little influenced by a change of the input signal frequency. Therefore, the level detector can exactly detect the level of the input signal to the amplitude-limiting amplifying circuit over a wide frequency range.

Figure 4:
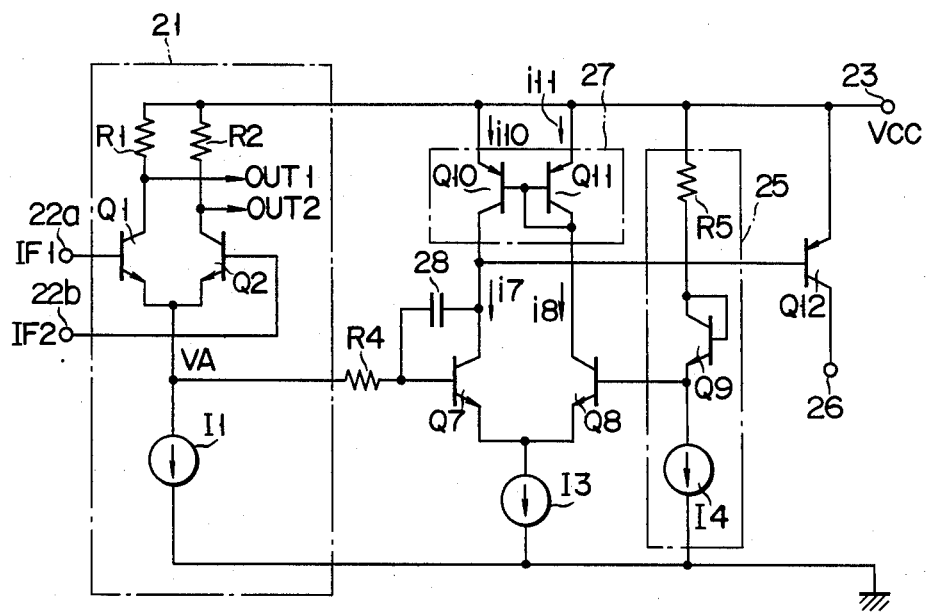
FIGS. 4 and 5 are circuit diagrams of other embodiments of a level detector according to the present invention.

Turning now to FIG. 4, there is shown another embodiment of a level detector according to the present invention. As shown, an interjunction of the emitters of the transistors Q1 and Q2 in the amplitude-limiting amplifying circuit 21 is connected through the resistor R4 to the base of the NPN transistor Q7. The emitter of the transistor Q7 is connected to the emitter of the NPN transistor Q8. Those transistors Q7 and Q8 form a differential pair. The constant current source circuit I3 is inserted between the emitter node of these transistors Q7 and Q8 and ground. Inserted between the collectors of the transistors Q7 and Q8 and the power source terminal 23 is a current mirror circuit 27 made up of PNP transistors Q10 and Q11. A mirror capacitor 28 is connected between the base and the collector of the transistor Q7. The base of the transistor Q8 is connected to the emitter of an NPN transistor Q9. The base and the collector of the transistor Q9 are connected together and to the power source terminal 23 through a resistor R5. A constant current source I4 is connected between the emitter of the transistor Q9 and ground. The interjunction of the transistors Q7 and Q10 is wired to the base of an output transistor Q12 of the PNP type. The emitter of the transistor Q12 is connected to the power source terminal 23, while the collector is connected to the output terminal 26. The resistor R5, the transistor Q9, and the constant current source I4 cooperate to make up a bias circuit 25. The bias circuit 25 biases, through the emitter of the transistor Q9, the transistor Q8 so that when no signal is input to the transistor Q7, a base potential VB8 of the transistor Q8 is higher than a base potential VB7 of the transistor Q7.

With such an arrangement, at the time of no signal, the following relation holds:

i8=i11=i10<i7 where i7, i8, i10, and i11 are respectively the currents through the collectors of the transistors Q7 and Q8, and the currents flowing through the emitters of the transistors Q10 and Q11. This relation indicates that when no signal is applied to the transistor Q7, no current flows from the output transistor Q12 for level detection. When the input signals IF1 and IF2 are applied to the amplitude-limiting amplifying circuit 21, the base potential VB7 of the transistor Q7 is larger than the base potential VB8 of the transistor Q8, and i7<i8. Then, current flows from the level detecting transistor Q12. In this case, if a ripple component is contained in the input signals IF1 and IF2, it is smoothed by the input resistor R4 and the mirror capacitor 28 of the transistor Q7, so that a smoothed level detected output is produced. When the frequencies of the input signals IF1 and IF2 are low, the mirror capacitor must be formed separately from the transistor Q7.

Figure 5:
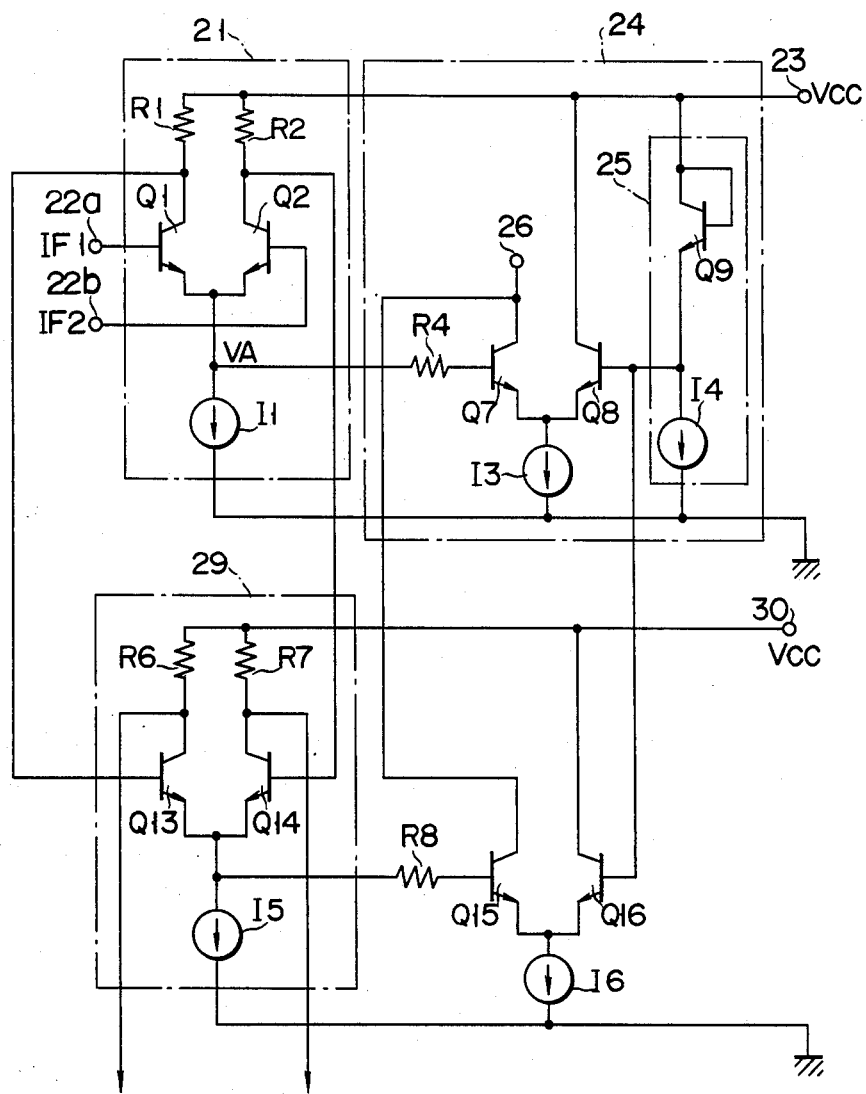

While in the above-mentioned embodiments, the level detector according to the present invention is applied to one of the IF multiple stages, a plurality of level detectors may be provided respectively associated with a plurality of IF stages. In this case, the output terminals of the level detectors are interconnected. This alternative arrangement is capable of effecting a level detection over a large variety of amplitudes of the input signal. This idea may be implemented as shown in FIG. 5. The circuit arragement of FIG. 5 employs only two level detectors for the two IF stages, for simplicity. As shown, the outputs of a first-stage differential amplifier circuit 21, or amplitude-limiting amplifying circuit, are coupled with the bases of differentially paired NPN transistors Q13 and Q14 forming a second stage differential amplifier circuit 29. The emitters of the transistors Q13 and Q14 are connected together. A constant current source I5 is inserted between the emitter interjunction and ground. The collectors of the transistors Q13 and Q14 are respectively connected to load resistors R6 and R7 which are then connected together and to the power source terminal 30 for the power voltage Vcc. The leads, respectively connecting to the nodes between the resistor R6 and the transistor Q13 and between the resistor R7 and the transistor Q14, are coupled with the succeeding differential amplifier circuit 21 or an audio detector. The base of an NPN transistor Q15 is connected through an input resistor R8 to a connection point between the emitter node of the transistors Q13 and Q14 and the constant current source circuit I5. The emitters of the transistors Q15 and Q16 are interconnected to provide an interjunction. The interjunction is further connected to ground, through a constant current circuit I6. The collector of the transistor Q15 is connected to the output terminal 26. The transistor Q16 is connected at the collector to the power source terminal 30 and at the base to the bias circuit 25.

As described above, each stage of the level detector circuits operates in the same manner as the FIG. 2 circuit. Further, since the output terminals of the level detectors are interconnected, the level detection is possible over a variety of amplitudes of the input signals.

What is claimed is:

1. A voltage level detecting circuit comprising:

first and second input terminals for receiving differential input signals;
a first transistor having a base connected to said first input terminal, an emitter and a collector;
a second transistor having a base connected to said second input terminal, an emitter connected to the emitter of said first transistor, and a collector;
a power source terminal for receiving a power source voltage with respect to a ground potential;
a first load resistor electrically connected between said power source terminal and the collector of said first transistor;
a second load resistor electrically connected between said power source terminal and the collector of said second transistor;
a first constant current source electrically connected between the junction of the emitters of said first and second transistors and the ground potential;
an output terminal for supplying a signal representing a detected voltage level;
a third transistor having a collector connected to said output terminal, a base connected to the junction of the emitters of said first and second transistors, and an emitter;
a fourth transistor having an emitter connected to the emitter of said third transistor, a collector connected to said power source terminal, and a base;
a second constant current source electrically connected between the junction of the emitters of said third and fourth transistor and the ground potential; and
bias voltage circuit means for applying a predetermined bias voltage to the base of said fourth transistor.

2. The voltage level detecting circuit according to claim 1, wherein said bias voltage circuit means comprises a fifth transistor having a base, a collector and an emitter, said base and said collector being connected to said power source terminal, and a constant current source being electrically connected between the emitter of said fifth transistor and the ground potential.

3. The voltage level detecting circuit according to claim 1, further comprising a resistor electrically connected between the base of said third transistor and the junction of the emitters of said first and second transistors.

4. Apparatus for detecting a voltage level, comprising:

a plurality of serially-connected voltage level detecting circuits, each of said detecting circuits acting as a stage of said voltage level detecting apparatus and comprising:
first and second input terminals for receiving differential input signals;
a first transistor having a base connected to said first input terminal, an emitter and a collector;
a second transistor having a base connected to said second input terminal, an emitter connected to the emitter of said first transistor, and a collector;
a power source terminal for receiving a power source voltage with respect to a ground potential;
a first load resistor electrically connected between said power source terminal and the collector of said first transistor;
a second load resistor electrically connected between said power source terminal and the collector of said second transistor;

a first constant current source electrically connected between the junction of the emitters of said first and second transistors and the ground potential;

an output terminal for supplying a signal representing a detected voltage level;

a third transistor having a collector connected to said output terminal, a base connected to the junction of the emitters of said first and second transistors, and an emitter;

a fourth transistor having an emitter connected to the emitter of said third transistor, a collector connected to said power source terminal, and a base;

a second constant current source electrically connected between the junction of the emitters of said third and fourth transistor and the ground potential; and bias voltage circuit means for applying a predetermined bias voltage to the base of said fourth transistor;

the junction of the first transistor and first load resistor of each of said detecting circuits being connected to the base of the first transistor of the next-stage circuit;

the junction of the second transistor and second load resistor of each of said detecting circuits being connected to the base of the second transistor of the next-stage circuit;

the collector of the third transistors of each of said detecting circuits being jointly connected; and the bases of the fourth transistors of each of said detecting circuits being jointly connected.

5. A voltage level detecting circuit comprising:

first and second input terminals for receiving differential input signals;

a first transistor having a base connected to said first input terminal, an emitter and a collector;

a second transistor having a base connected to said second input terminal, an emitter connected to the emitter of said first transistor, and a collector;

a power source terminal for receiving a power source voltage with respect to a ground potential;

a first load resistor electrically connected between said power source terminal and the collector of said first transistor;

a second load resistor electrically connected between said power source terminal and the collector of said second transistor;

a first constant current source electrically connected between the junction of the emitters of said first and second transistors and the ground potential;

a third load resistor having a first end connected to the junction of the emitters of said first and second transistors, and a second end;

a third transistor having a base connected to said second end of the third load resistor, a collector and an emitter;

a mirror capacitor electrically connected between the base and collector of said third transistor;

a fourth transistor having an emitter connected to the emitter of said third transistor, a collector and a base;

a second constant current source electrically connected between the junction of the emitters of said third and fourth transistor and the ground potential;

bias voltage circuit means for applying a predetermined bias voltage to the base of said fourth transistor;

a current mirror circuit for supplying a constant current to the collectors of said third and fourth transistors;

an output terminal for supplying a signal representing a detected voltage level; and a fifth transistor having a collector connected to said output terminal, an emitter connected to said power source terminal, and a base connected to the collector of said third transistor.

6. the voltage level detecting circuit according to claim 5, wherein said bias voltage circuit means comprises:

a resistor having a first end connected to said power source terminal, and a second end;

a transistor having a base, a collector and an emitter, said base and collector being connected to the second end of said resistor; and a constant current source electrically connected between the emitter of said transistor and the ground potential.

* * * * *